United States Patent
Nakamura (10) Patent No.: US 7,248,507 B2
(45) Date of Patent: Jul. 24, 2007

(54) CMIS SEMICONDUCTOR NONVOLATILE STORAGE CIRCUIT

(75) Inventor: Kazuyuki Nakamura, Fukuoka (JP)

(73) Assignee: Nscore Inc., Kitakyushu-shi, Fukuoka (JP)

( * ) Notice: Subject to any disclaimer, the term of this patent is extended or adjusted under 35 U.S.C. 154(b) by 0 days.

(21) Appl. No.: 11/637,481

(22) Filed: Dec. 12, 2006

(65) Prior Publication Data
US 2007/0091663 A1    Apr. 26, 2007

Related U.S. Application Data

(63) Continuation of application No. 11/153,113, filed on Jun. 15, 2005, now Pat. No. 7,151,706, which is a continuation of application No. PCT/JP2003/016143, filed on Dec. 17, 2003.

(30) Foreign Application Priority Data
Dec. 19, 2002    (JP) .............................. 2002-367648

(51) Int. Cl.
    *G11C 8/00*    (2006.01)
(52) U.S. Cl. ............................ 365/189.05; 365/230.08; 365/100

(58) Field of Classification Search ........... 365/189.05, 365/203.08, 100
See application file for complete search history.

(56) References Cited

U.S. PATENT DOCUMENTS 4,578,781 A * 3/1986 Ogawa et al. .............. 365/203

* cited by examiner

*Primary Examiner*—Richard T. Elms
*Assistant Examiner*—N Nguyen
(74) *Attorney, Agent, or Firm*—Ladas & Parry LLP

(57) ABSTRACT

A nonvolatile semiconductor memory circuit includes a selection line, a first bit line, a second bit line, a first MIS transistor having a first gate coupled to the selection line, a first drain coupled to the first bit line via a first node, and a first source coupled to a predetermined potential, a second MIS transistor having a second gate coupled to the selection line, a second drain coupled to the second bit line via a second node, and a second source coupled to the predetermined potential, and a latch circuit coupled to the first node and the second node to store data responsive to a signal difference between the first node and the second node, wherein the selection line is operative to supply a write potential that creates a lingering change in a threshold voltage of one of the first MIS transistor and the second MIS transistor.

1 Claim, 9 Drawing Sheets

CMIS SEMICONDUCTOR NONVOLATILE STORAGE CIRCUIT

CROSS-REFERENCE TO RELATED APPLICATION

This is a continuation of International Application No. PCT/JP2003/016143, filed on Dec. 17, 2003, the entire contents of which are hereby incorporated by reference.

BACKGROUND OF THE INVENTION

1. Field of the Invention

The present invention relates to a configuration of a nonvolatile semiconductor memory which is capable of retaining stored data without a power supply voltage applied thereto.

2. Description of the Related Art

Nonvolatile memories which have already been put to practical use or still being developed include flash EEPROMs employing a floating gate structure, FeRAMs employing a ferroelectric film, MRAMs employing a ferromagnetic film, etc.

Figure 14A:
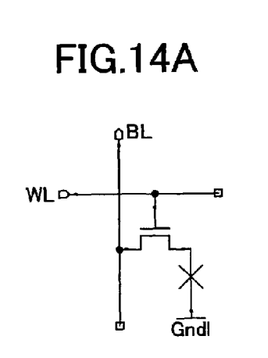
FIGS. 14A through 14D are illustrative drawings showing examples of conventional semiconductor memory circuits.

FIGS. 14A through 14D are circuit diagrams showing a unit of storage (memory cell) of conventional memories. FIG. 14A illustrates a mask ROM, in which information indicative of either "0" or "1" stored at each memory cell is determined at the time of manufacturing. This information cannot be rewritten. The present invention relates to a nonvolatile memory in which information can be rewritten, and the mask ROM does not belong to this category.

Figure 14B:
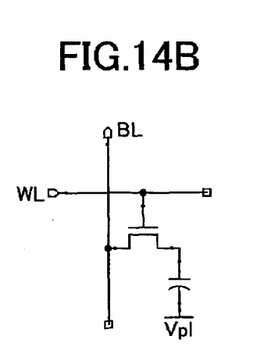
Figure 14C:
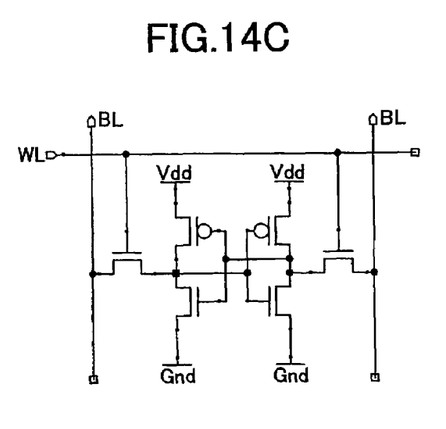

FIG. 14B is a memory cell of a dynamic RAM (DRAM), and FIG. 14C is a memory cell of a static RAM (SRAM). These can retain stored information only when a power supply voltage is being applied. When the power supply is stopped, the stored information will be lost. The SRAM, in particular, has a circuit structure comprised of MOS transistors only, and can be implemented by use of a standard CMOS process used for logic LSIs without requiring any special process.

Figure 14D:
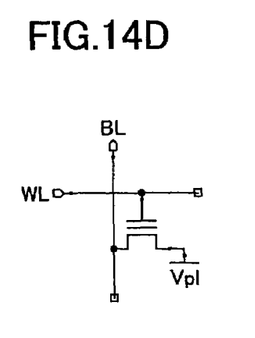
Figure 15A:
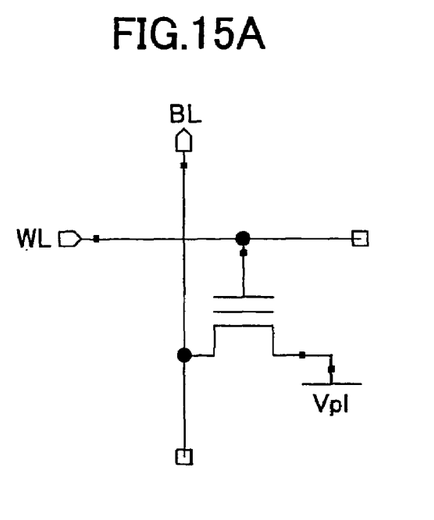
FIGS. 15A and 15B are illustrative drawings showing the construction of a conventional flash EEPROM.
Figure 15B:
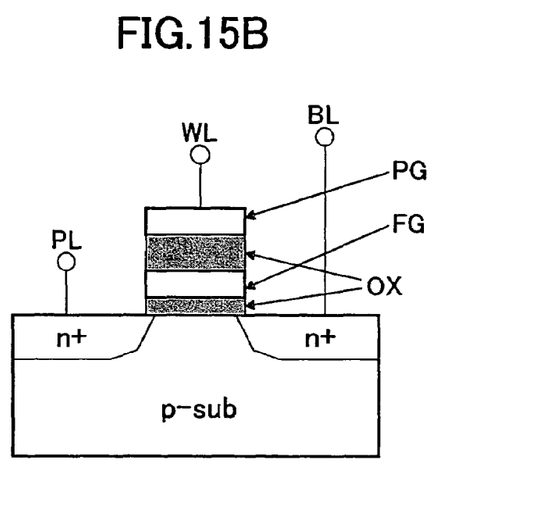

FIG. 14D is a ROM in which information is electrically rewritable. This ROM is conventionally referred to as an EEPROM. FIGS. 15A and 15B illustrate a basic structure of a special transistor constituting such ROM. As a notable feature, an electrode that is not electrically coupled to anywhere, referred to as a floating gate (FG), is provided between the original MOS transistor gate and the substrate.

Figure 16A:
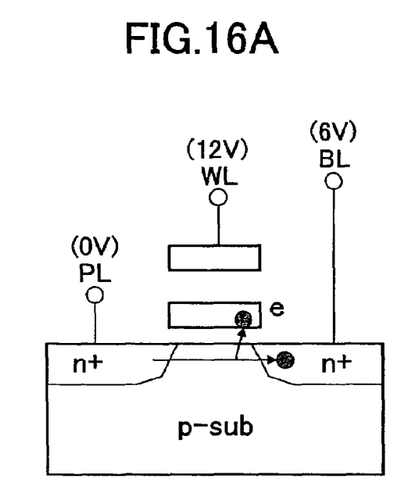
FIGS. 16A and 16B are illustrative drawings showing the operation principle of a write operation with respect to the conventional flash EEPROM.
Figure 16B:
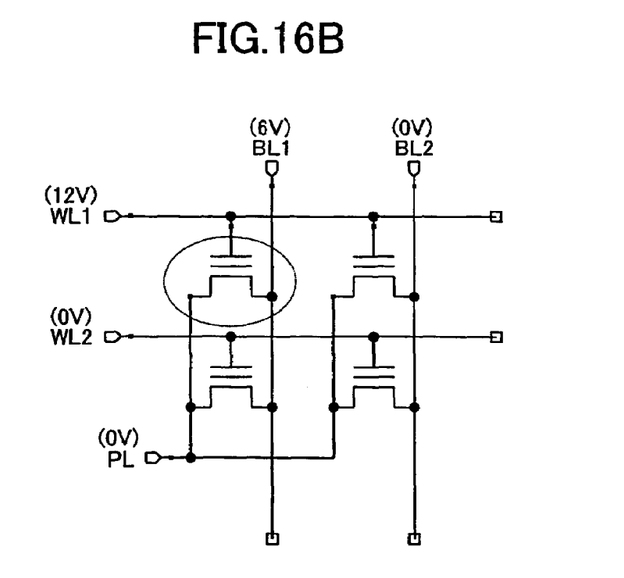

A description will be given of the principle of the circuit operation of this EEPROM by referring to FIGS. 16A and 16B, FIGS. 17A and 17B, and FIGS. 18A and 18B as examples. In the case of an operation for writing information, as shown in FIGS. 16A and 16B, 6 V is applied to a bit line (BL), 12 V applied to a word line, and 0 V applied to a plate line (PL), for example. Due to the voltage applied to the word line, the gate receives a voltage of 12 V. Under this condition, the floating gate (FG) portion has a voltage applied thereto that ranges approximately from 1 V to 3 V, resulting in a channel being created as a path for electrons in the surface of the substrate (p-sub). The transistor is operating in the saturation region, and its channel is pinched off near the drain, so that a strong electric field is present in the proximity of the drain. Some of the electrons accelerated by this electric field jump into the floating gate. Because of this, the floating gate ends up retaining the electrons, resulting in the threshold voltage of the transistor being shifted toward a higher voltage as viewed from the gate node (word line). The injection of electrons into the floating gate is performed selectively and separately for each cell, thereby achieving the writing of information.

Figure 17A:
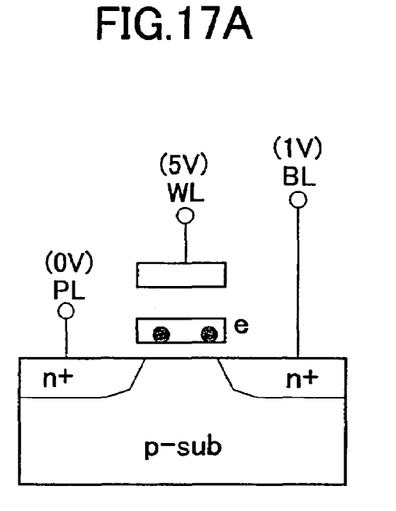
FIGS. 17A and 17B are illustrative drawings showing the operation principle of a read operation with respect to the conventional flash EEPROM.
Figure 17B:
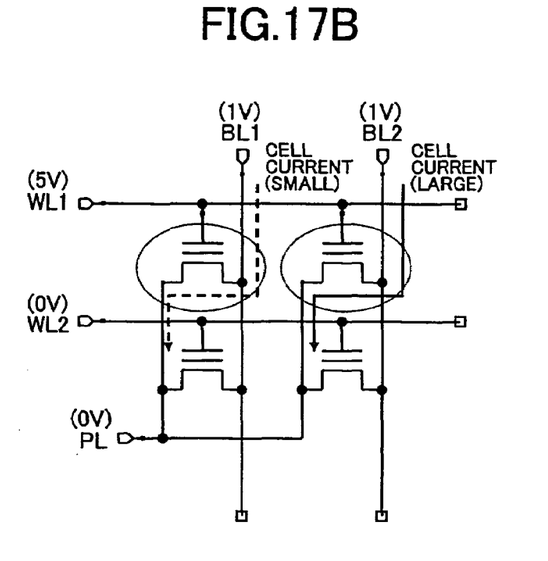

In the case of a read operation shown in FIGS. 17A and 17B, a difference in the threshold voltages shifted as described above is read as an electric current. 5 V is applied to the word line, 1 V applied to the bit line (BL), and (0V) applied to the plate line, for example. As a result, the transistors having floating gates connected to the word line have a read current (cell current) running therethrough. This cell current has an increased/decreased amount, depending on the high/low of the threshold voltage. The cell current is then amplified for the retrieval of information.

Figure 18A:
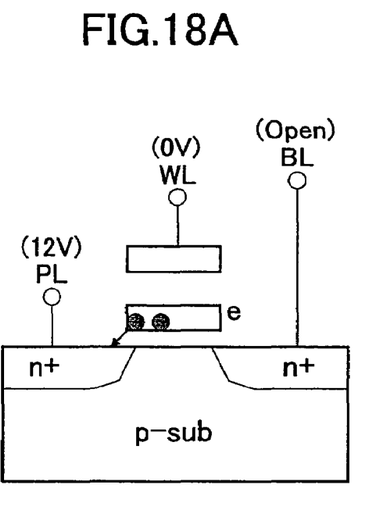
FIGS. 18A and 18B are illustrative drawings showing the operation principle of an erase operation with respect to the conventional flash EEPROM.
Figure 18B:
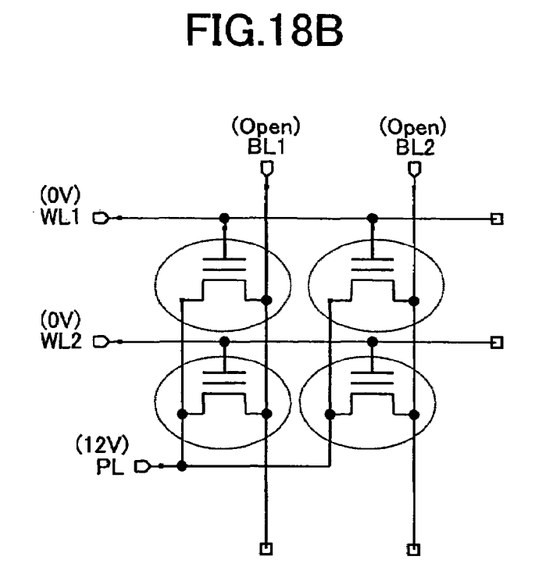

FIGS. 18A and 18B illustrate the principle of erasing information in a cell, i.e., removing electrons from the floating gate. The word line is fixed at 0 V, and the plate line is set to 12 V. A large potential difference thus develops between the plate and the floating gate, and the resultant electric field serves to remove electrons from the floating gate. This operation is performed with respect to all the memory cells that share the same plate line. The detail of the conventional memory operations described above is described in a large number of reference literatures (e.g., Tadayoshi Enomoto, "CMOS Integrated Circuit—From Entry to Practical Use", Baifuukan, 1996, etc.).

For the EEPROMs that are conventional nonvolatile memories, there is a need to manufacture a transistor having the special construction, i.e., a transistor having a floating gate. As for FeRAMs and MRAMs, which achieve nonvolatile storage by use of ferroelectric material and ferromagnetic material, respectively, there is a need to form and process the film made of these materials. This is one of the big issues that need to be solved before practical use is achieved, and is also one of the factors that result in an increase in the manufacturing costs. There are memories, on the other hand, that store data by utilizing circuitry structure without requiring any special process. Such memories include SRAMs and DRAMs. SRAMs, in particular, do not require any special process in addition to the CMOS-type process, but have a drawback in that the stored contents are lost at power-off.

The issue to be solved is to provide a circuit that is CMOS-type process compatible and has a nonvolatile memory function.

SUMMARY OF THE INVENTION

It is a general object of the present invention to provide a nonvolatile semiconductor memory circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory circuit particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory circuit, which includes a selection line, a first bit line, a second bit line, a first MIS transistor having a first gate coupled to said selection line, a first drain coupled to the first bit line via a first node, and a first source coupled to a predetermined potential, a second MIS transistor having a second gate coupled to said selection line, a second drain coupled to the second bit line via a second node, and a second source coupled to said predetermined potential; and a latch circuit coupled to the first node and the second node to store data responsive to a signal difference between the first node and the second node, wherein the selection line is operative to supply a write potential that creates a lingering change in a threshold voltage of one of the first MIS transistor and the second MIS transistor.

According to another aspect of the present invention, a nonvolatile semiconductor memory device includes a plurality of bit-line pairs, a plurality of memory units arranged in a matrix, one of said memory units coupled-to a corresponding one of said bit-line pairs, said corresponding one of said bit-line pairs including a first bit line and a second bit line, said one of said memory units including a selection line, a first MIS transistor having a first gate coupled to said selection line, a first drain coupled to the first bit line via a first node, and a first source coupled to a predetermined potential, a second MIS transistor having a second gate coupled to said selection line, a second drain coupled to the second bit line via a second node, and a second source coupled to said predetermined potential, and a latch circuit coupled to the first node and the second node to store data responsive to a signal difference between the first node and the second node, wherein the selection line is operative to supply a write potential that creates a lingering change in a threshold voltage of one of the first MIS transistor and the second MIS transistor.

According to another aspect of the present invention, a nonvolatile semiconductor memory circuit includes a selection line, a first bit line, a second bit line, a first MIS transistor having a first gate coupled to said selection line, a first drain coupled to the first bit line via a first node, and a first source coupled to a predetermined potential, a second MIS transistor having a second gate coupled to said selection line, a second drain coupled to the second bit line via a second node, and a second source coupled to said predetermined potential, and a latch circuit coupled to the first node and the second node to store data responsive to a signal difference between the first node and the second node, wherein the selection line is operative to supply a write potential that creates a lingering change in a resistance of one of the first MIS transistor and the second MIS transistor.

According to another aspect of the present invention, a nonvolatile semiconductor memory device includes a plurality of bit-line pairs, a plurality of memory units arranged in a matrix, one of said memory units coupled to a corresponding one of said bit-line pairs, said corresponding one of said bit-line pairs including a first bit line and a second bit line, said one of said memory units including a selection line, a first MIS transistor having a first gate coupled to said selection line, a first drain coupled to the first bit line via a first node, and a first source coupled to a predetermined potential, a second MIS transistor having a second gate coupled to said selection line, a second drain coupled to the second bit line via a second node, and a second source coupled to said predetermined potential, and a latch circuit coupled to the first node and the second node to store data responsive to a signal difference between the first node and the second node, wherein the selection line is operative to supply a write potential that creates a lingering change in a resistance of one of the first MIS transistor and the second MIS transistor.

According to another aspect of the present invention, a method of writing data to a memory circuit including a first MIS transistor and a second MIS transistor includes storing data in a latch circuit, and applying to a gate of the first MIS transistor and a gate of the second MIS transistor a common potential that causes a lingering change in a threshold voltage of the first MIS transistor or the second MIS transistor, whichever is selected in response to the data.

According to another aspect of the present invention, a nonvolatile semiconductor memory circuit includes two MISFET-type transistors having substantially same characteristics, characterized in that a conductive state of the first transistor is controlled by controlling a voltage of a gate electrode of the first transistor to be a voltage other than a power supply potential and a ground potential for a predetermined period, thereby inducing a secular deterioration in an on-resistance thereof, which causes a performance difference between the first and second transistors, the performance difference being read as a current difference between the two transistors simultaneously made conductive, thereby storing and reading "0", and, conversely, a performance of the second transistor is degraded greater than the first transistor, thereby storing "1".

According to another aspect of the present invention, a nonvolatile semiconductor memory circuit includes a static-type semiconductor memory cell comprised of 6 MIS transistors and having two storage nodes, the nonvolatile semiconductor memory circuit as described above, the two transistors of which have current output nodes coupled to the two storage nodes, and a third transistor coupled between a power supply node of said static-type semiconductor memory cell and an actual power supply line, characterized in that a conductive state of said third transistor is controlled so as to control activation/deactivation of operation of said static-type semiconductor memory cell, and information stored in the nonvolatile semiconductor memory circuit is transferred to the static-type memory cell.

According to at least one embodiment of the present invention, a nonvolatile storage is implemented without introducing a new material or an additional manufacturing step to the CMOS-type process, thereby achieving cost reduction and shorter development periods.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 1A:
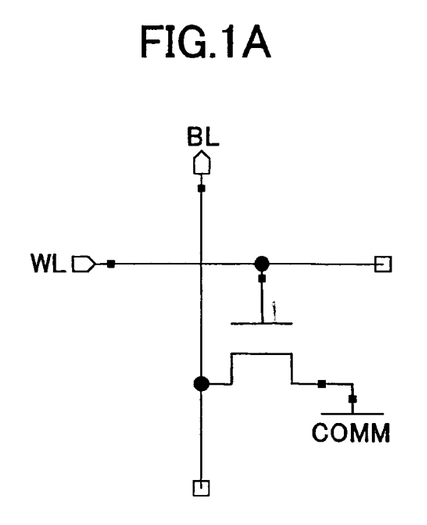
FIGS. 1A and 1B are illustrative drawings showing a basic circuit and its device-level operation principle according to the present invention.
Figure 1B:
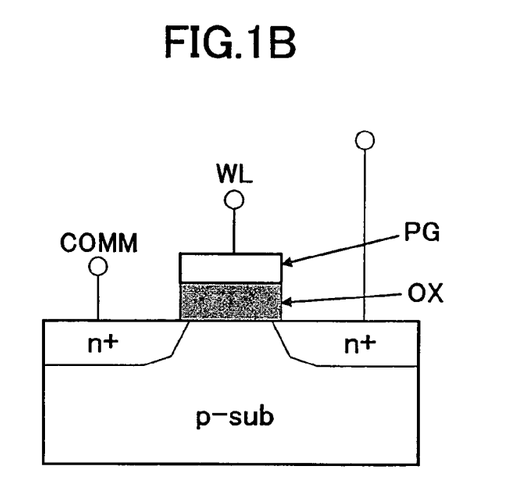
Figure 2A:
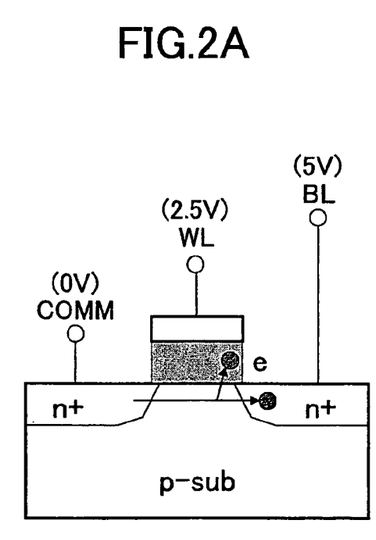
FIGS. 2A and 2B are illustrative drawings showing a write operation and its device-level operation principle with respect to the basic circuit of the present invention.
Figure 2B:
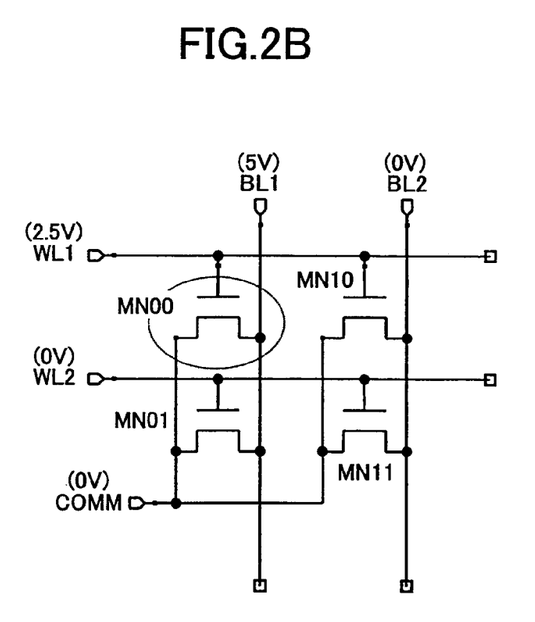

FIGS. 1A and 1B are illustrative drawings showing a basic circuit and its device-level operation principle according to the present invention. FIGS. 1A and 1B show an example in which a typical n-channel-type silicon MOS transistor is used as an MIS (metal-insulating film-semiconductor) transistor. WL denotes a word line, BL a bit line, COMM a common line, PG a gate electrode, OX a silicon-oxide film, n+ an n-type impurity diffusion layer, and psub a p-type silicon substrate. With reference to FIGS. 2A and 2B and FIGS. 3A and 3B, the operation principle of the circuit of FIGS. 1A and 1B will be described. In the case of an operation for writing information, as shown in FIGS. 2A and 2B, 5 V is applied to the bit line (BL), 2.5 V applied to the word line, and 0 V applied to the common line (COMM). Due to the word line voltage, a channel is created as a path for electrons in the surface of the substrate (p-sub). The transistor is operating in the saturation region, and its channel is pinched off near the drain, so that a strong electric field is present in the proximity of the drain. Some of the electrons accelerated by this electric field jump into the oxide film. This phenomenon is known as a secular change in the transistor characteristics caused by hot carriers in MOS transistors, and is not desired for the purpose of maintaining the performance of the semiconductor circuit for a long term. In order to avoid this, a countermeasure is taken to control the density distribution in the drain diffusion layer, thereby preventing an electrical field from concentrating near the drain node, for example. The present invention actively utilizes this phenomenon, and achieves information writing by use of a shift, to a higher voltage, of the threshold voltage of a transistor as viewed from the gate node (word line), which is caused by electrons caught in the oxide film. The injection of electrons into the oxide film is performed selectively and separately for each cell, thereby achieving the writing of information. As devices are made on an increasingly fine scale, the intensity of a local electric field within the devices tend to increase. This phenomenon by which electrons are injected into oxide films are thus increasingly likely to occur. It is thus fair to say that the writing of information according to this principle will be increasingly easier as the miniaturization is further advanced.

Figure 3A:
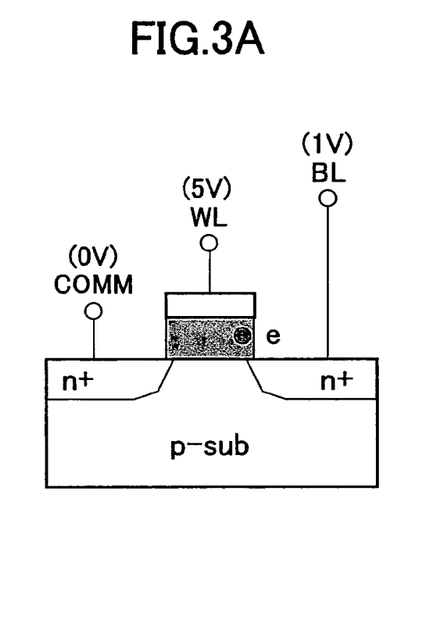
FIGS. 3A and 3B are illustrative drawings showing a read operation and its device-level operation principle with respect to the basic circuit of the present invention.
Figure 3B:
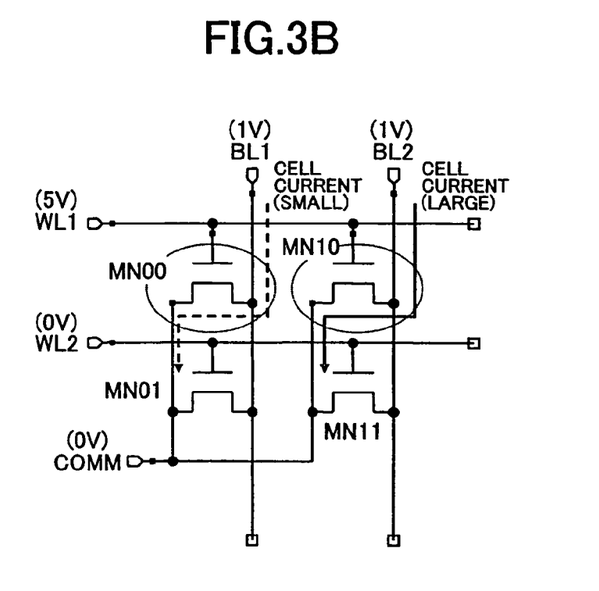

In the case of a read operation as shown in FIGS. 3A and 3B, a difference in the threshold voltages shifted as described above is read as an electric current. 5 V is applied to the word line, 1 V applied to the bit line (BL), and (0V) applied to the common line, for example. As a result, the transistors connected to the word line have a read current (cell current) running therethrough. This cell current has an increased/decreased amount, depending on the high/low of the threshold voltage. The cell current is then amplified for the retrieval of information. This resembles to the memory circuit structure of an EEPROM that was described in the description of the background art. What fundamentally differs is, however, that it is extremely difficult, technically, to remove the electrons injected into the oxide film to erase the information. That is, it is possible to shift the threshold voltage of a transistor to a higher voltage by injecting electrons into the oxide film, but it is not possible to shift the threshold voltage to a lower voltage in the opposite direction. Basically, thus, writing can be performed only once.

Figure 4A:
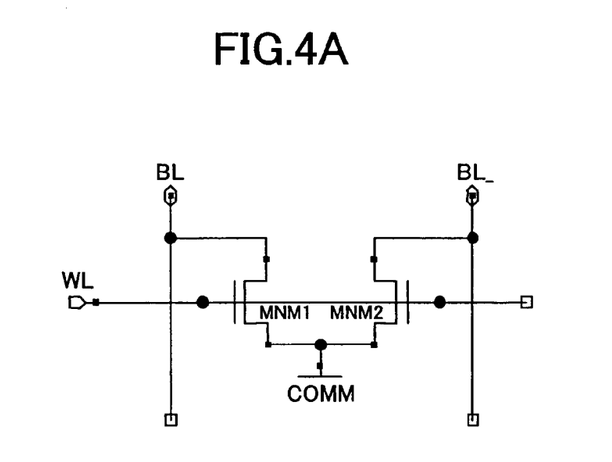
FIGS. 4A and 4B are illustrative drawings showing the operation principle of an overwrite operation with respect to a differential-type basic circuit according to the present invention (embodiment 1)
Figure 4B:
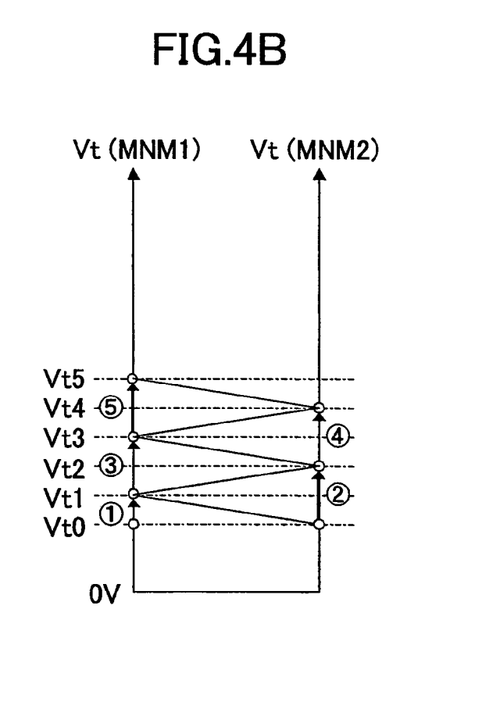
Figure 5A:
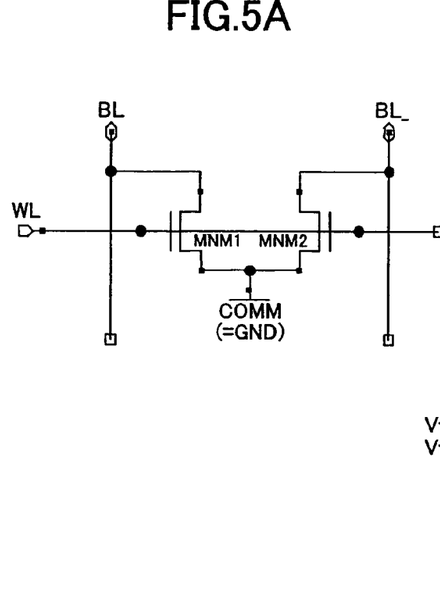
FIGS. 5A and 5B are illustrative drawings showing the operation principle of a write operation with respect to the differential-type basic circuit according to the present invention (embodiment 1)
Figure 5B:
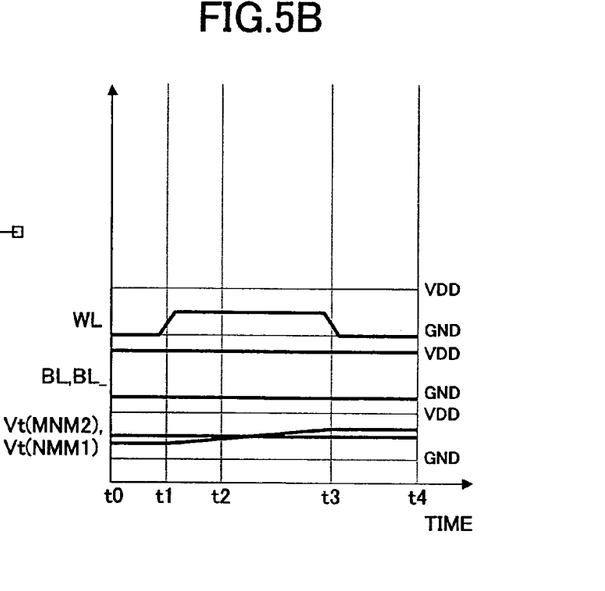
Figure 6A:
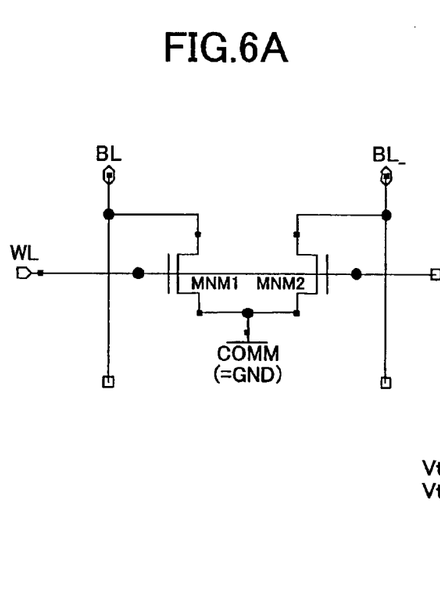
FIGS. 6A and 6B are illustrative drawings showing the operation principle of a read operation with respect to the differential-type basic circuit according to the present invention (embodiment 1)
Figure 6B:
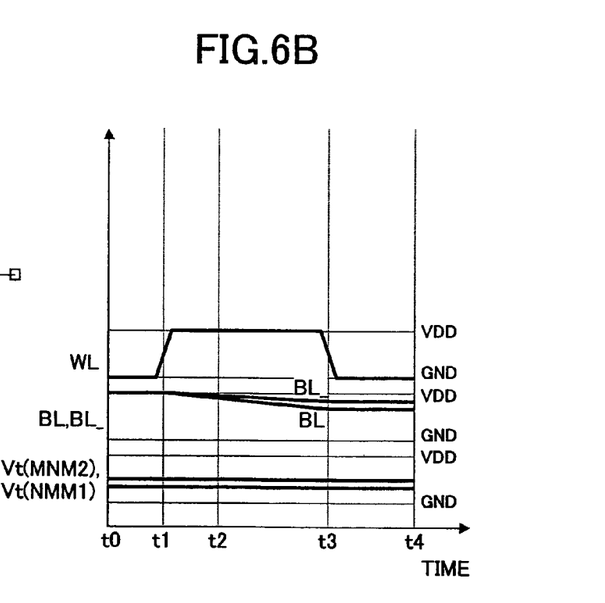

FIGS. 4A and 4B illustrate an embodiment that corresponds to a first invention of the present invention designed for the purpose of circumventing the above problem. Two transistors identical to the transistor of FIGS. 1A and 1B are combined to operate as a pair. Of the two transistors, a first transistor (MNM1) may have a threshold voltage Vt(MNM1) that is higher than a threshold voltage Vt(MNM2) of a second transistor (MNM2). This state may be treated as a memory state corresponding to information "0". The opposite state may then be treated as a memory state corresponding to "1". Namely, with the threshold voltages of MNM1 and MNM2 being both Vt0 in the initial state immediately after the manufacturing, writing "0" for the first time is performed by shifting the threshold voltage of MNM1 to a slightly higher voltage as shown as ① in FIG. 4B. That is, as shown in FIG. 5B, the word selecting signal WL is first set to 2.5 V approximately equal to half the power supply voltage (VDD). A state in which the bit line (BL) is set to 5 V (VDD) equal to the power supply voltage, and the BL_ side of the differential pair bit lines is set to 0 V (GND), is maintained for a predetermined duration. As a result, only MNM1 operates in the saturation region, and hot carriers are generated to shift the threshold voltage of MNM1 to a higher voltage (Vt1). The shift amount of the threshold voltage suffices if it is set greater than a level discernible by the capability of the readout circuit. When it is desired to write "1" to this memory cell, as shown as ② in FIG. 4B, the threshold voltage of MNM2 is raised to Vt2 above that of MNM1. Each time the inversion of information occurs, either MNM1 or MNM2 experiences a raise in its threshold voltage. The limit of such information rewriting is provided as a point at which the threshold voltage of MNM1 or MNM2 rises to reach the power supply voltage or its proximity. Provision of a voltage boosting circuit capable of generating a voltage higher than the power supply voltage may improve such limit to the number. With this configuration, it is possible to rewrite information "0" and "1" a limited number of times despite the fact that the erasure of information like the EEPROM is not possible. FIGS. 6A and 6B are illustrative drawings showing a read operation of the circuit of FIG. 4A. Reading is performed by setting the word selecting line approximately to the power supply voltage and also setting BL and BL_ to the same voltage, with a difference in the current capacity of the two transistors being read as a current difference caused by the difference in the threshold voltages of MNM1 and MNM2. In an example shown with the circuit in FIGS. 6A and 6B, BL and BL_ are precharged (charged) approximately to the power supply potential, followed by being set in a high-impedance state, and then coupled to MNM1 and MNM2. As a result, a current difference is again converted into a potential difference between BL an BL_.

Figure 7:
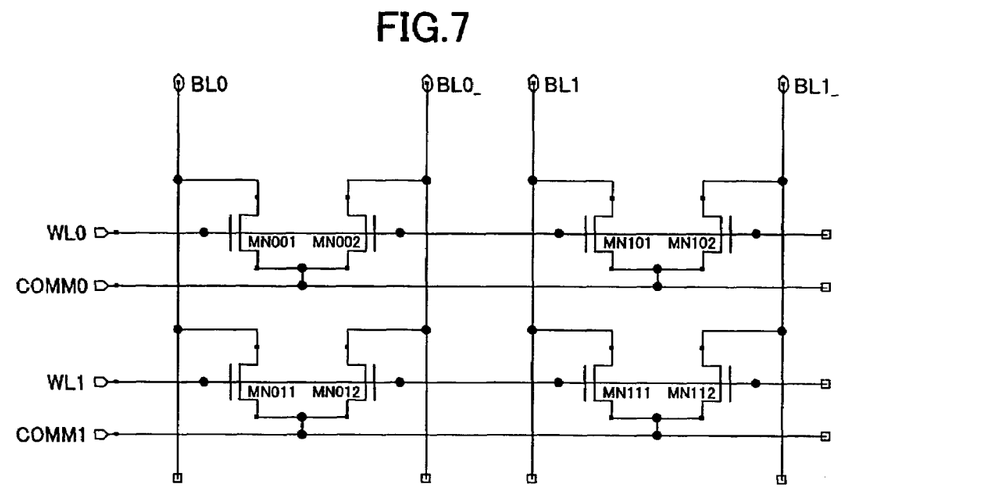
FIG. 7 is an illustrative drawing showing the arrangement of memory circuits with respect to the differential-type basic circuit according to the present invention (embodiment 1)

FIG. 7 is a drawing showing the configuration of memory when the circuit of FIG. 4A is arranged in a matrix form to be used as a practical memory device. In FIG. 7, information equal in amount to 4 bits can be stored. Word selecting lines (WL0, WL1) and bit line pairs (BL0, BL0_, BL1, BL1_) are shared by memory cells in the horizontal direction and in the vertical direction, respectively. Common lines (COMM0, COMM1) may be shared by all the memory cells that are two-dimensionally arranged.

Figure 8:
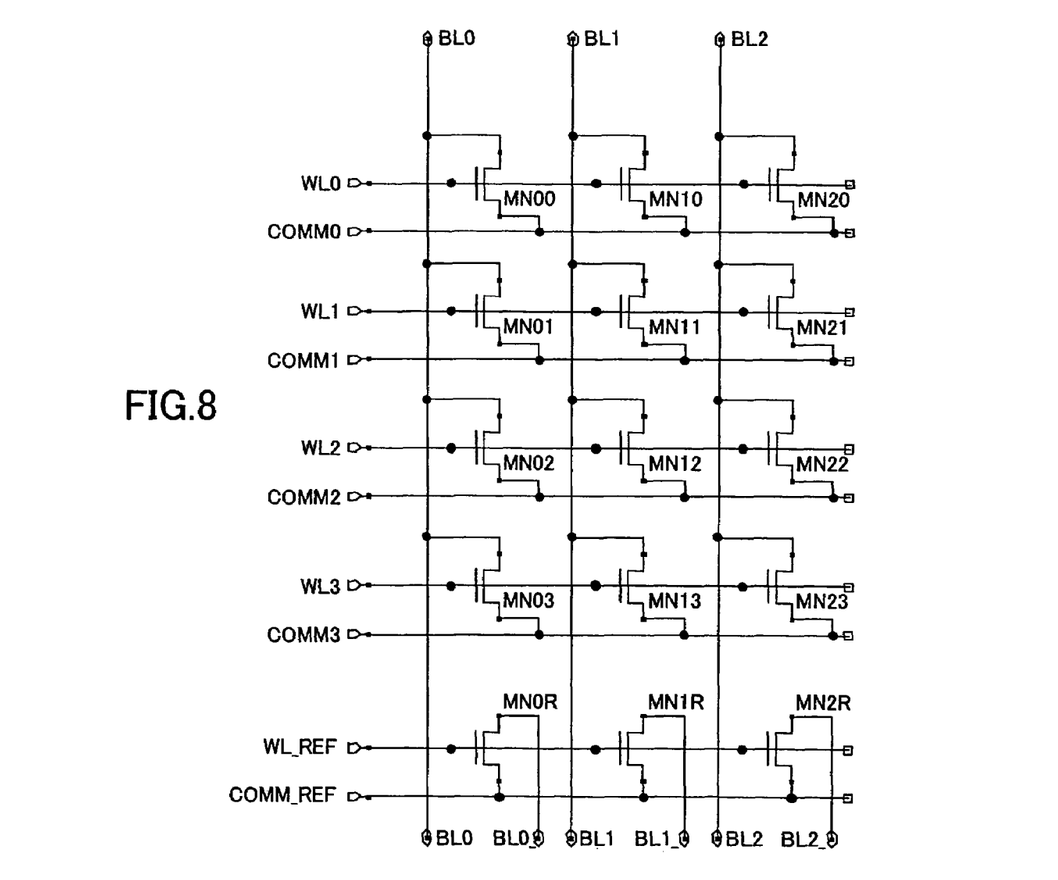
FIG. 8 is an illustrative drawing showing the arrangement of memory circuit elements according to a second invention of the present invention (embodiment 2)

FIG. 8 illustrates an embodiment that corresponds to a second invention of the present invention. In this embodiment, provision is made to share the second transistors of the two-transistor pairs, each of which serves as a unit of memory storage in the first invention. In FIG. 8, the memory cell array is configured such that information equal in amount to 12 bits is stored. Basically, a single transistor can store 1 bit information. A transistor that is paired up with this single transistor is shared on one bit line. That is, in FIG. 8, four transistors MN00, MN01, MN02, and MN03 are compared with MN0R, for example. Namely, among the transistors connected to the bit line BL0, a transistor having a threshold voltage higher than that of MN0R stores "0" therein, and a transistor having a threshold voltage lower than that of MN0R stores "1" therein. When information is to be rewritten, the threshold of MN0R is set higher than the threshold of a transistor that is to be rewritten from "0" to "1" among the transistors connected to BL0. If all the transistors connected to BL0 store information "1" therein, and/or if only the rewriting of "1" to "0" is to be performed, there is no need to change the threshold voltage of MN0R. Although the transistors are shared on a per-bit-line basis in FIG. 8, they may alternatively be shared on per-memory-block basis.

Figure 9:
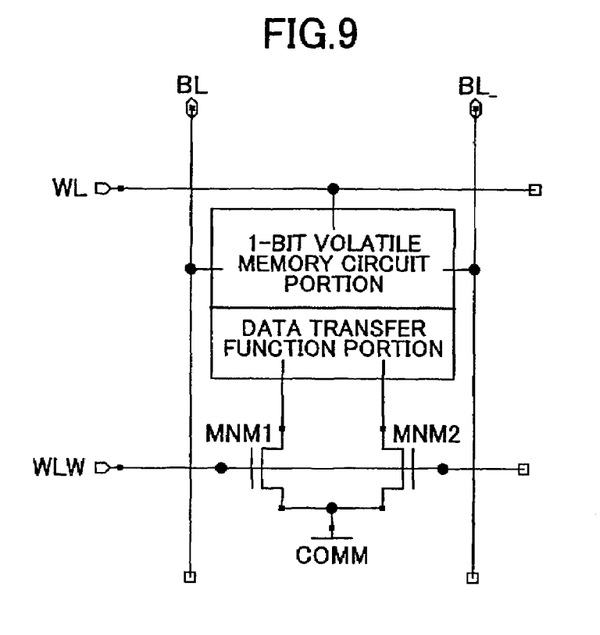
FIG. 9 is an illustrative drawing showing a basic configuration of an SRAM hybrid basic circuit according to the present invention (embodiment 3)

FIG. 9 illustrates an embodiment that corresponds to a third invention of the present invention. In FIG. 9, MNM1 and MNM2 are the same as those of the circuit of FIG. 4A, and serve to store information that is written through unidirectional shifting of threshold voltages. There is a limit to the number of writings that can be performed in the circuit of FIG. 4A. In consideration of this, the circuit of FIG. 9 includes, for one unit of information storage, the circuit as shown in FIG. 4A and a volatile memory portion such as an SRAM memory cell. The circuit of the third invention is configured such that information is read/written from/to the nonvolatile memory portion through the volatile memory portion as such need arises. This configuration allows routine read/write operations to be performed with respect to the volatile memory portion. At the timing immediately prior to power-off, for example, data is written to the nonvolatile portion, thereby reducing the effect of the limited number of writings that can be performed with respect to the nonvolatile memory portion. Since the volatile memory circuit portion takes care of a read/write demand during the time the power is on, such combination with the volatile memory that is superior in terms of read/write speed can improve the performance of routine operations.

Figure 10A:
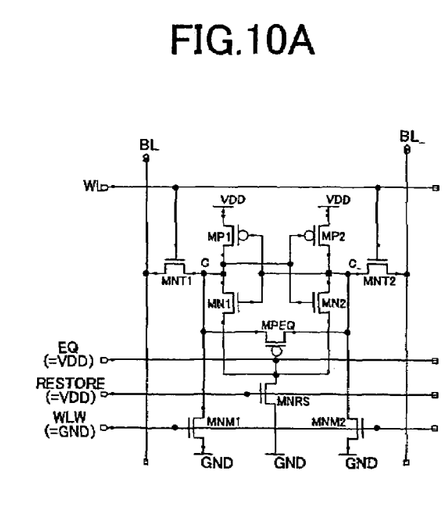
FIGS. 10A and 10B are illustrative drawings showing an operation of reading data from an SRAM portion in the SRAM hybrid basic circuit according to the present invention (embodiment 4)
Figure 10B:
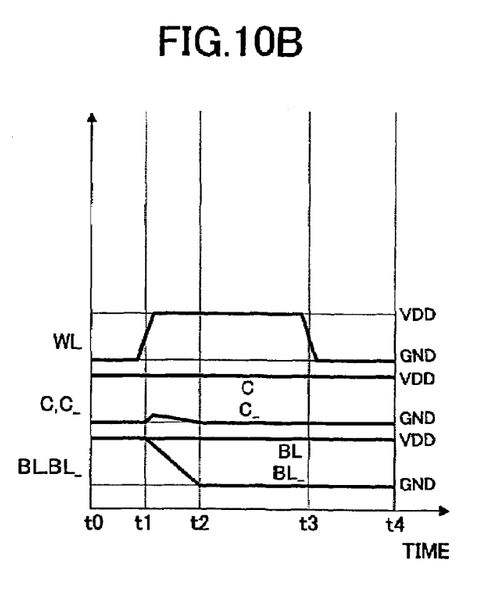
Figure 11A:
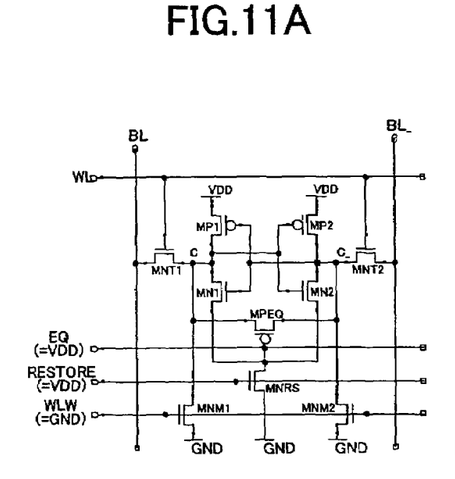
FIGS. 11A and 11B are illustrative drawings showing an operation of writing data to the SRAM portion in the SRAM hybrid basic circuit according to the present invention (embodiment 4)
Figure 11B:
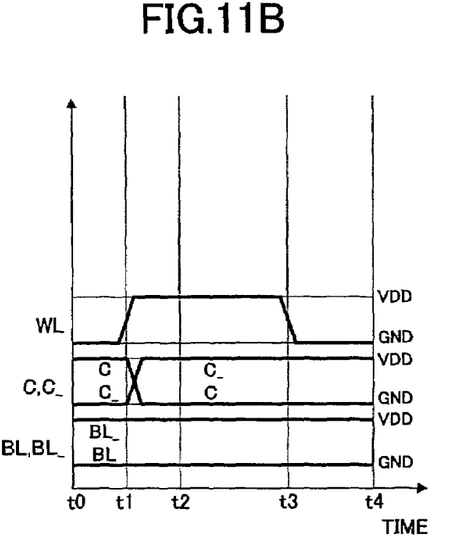
Figure 12A:
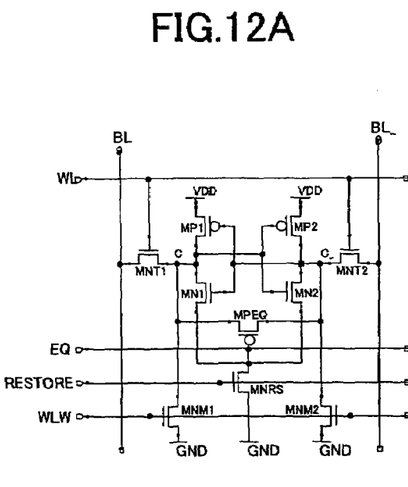
FIGS. 12A and 12B are illustrative drawings showing an operation of storing nonvolatile data with respect to the SRAM hybrid basic circuit according to the present invention (embodiment 4)
Figure 12B:
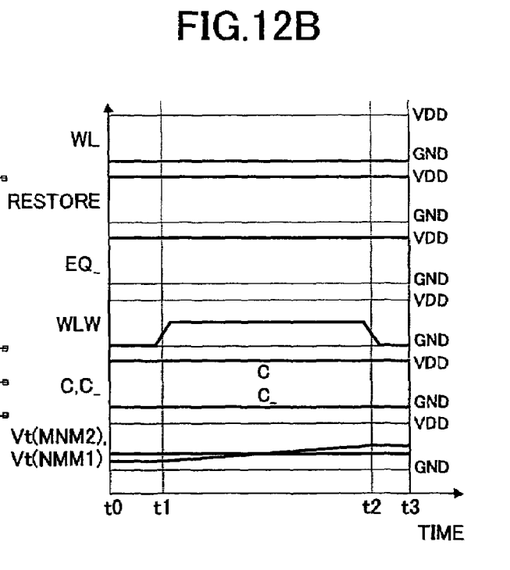

FIGS. 10A and 10B illustrate an embodiment that corresponds to a fourth invention of the present invention. The circuit of FIG. 10A is an example in which an SRAM memory cell is employed as the volatile memory portion of the third invention. In the circuit of FIG. 10A, three n-channel-type MISFET (MNRS, MNM1, MNM2) and one p-chnnel-type MISFET (MPEQ) are provided in addition to a conventional SRAM cell. Among these transistors, MNM1 and MNM2 are the two transistors that store information in a nonvolatile manner based on the state of respective MISFET threshold changes. When a RESTORE signal is set to a high level (power supply potential), a WLW signal to a low level (ground potential), and an EQ_ signal to the high level, MNM1, MNM2, and MPEQ are all placed in a nonconductive state, and MNRS is placed in a conductive state, thereby achieving the circuit configuration similar to the conventional SRAM as shown in FIG. 14C. In this state, information can be written/read to/from the memory cell through the same procedure as in the conventional SRAM as shown in FIGS. 10A and 10B and FIGS. 11A and 11B based on the manipulation of the word line (WL) and the pair of bit lines (BL, BL_). In order to write information in a nonvolatile manner, a nonvolatile-write word line (WLW) is set to a potential between the power supply potential and the ground potential for a predetermined duration as shown in FIG. 12B. At this time, one of the C node potential and the C_ node potential is at the power supply potential, and the other is at the ground potential, depending on the information stored in the SRAM memory cell. If the C node potential is higher, for example, the drain voltage of MNM1 is placed in a high state, resulting in a drain current flowing through MNM1. At this time, the gate voltage of MNM1 is placed at a potential between the power supply potential and the ground potential, so that the generation of hot carriers are induced within the channel in response to the drain current. Some of the hot carriers end up being trapped in the insulating film of the MIS structure. As a result, a change in the transistor performance, i.e., a minute shift of the threshold voltage, occurs. By keeping this state for a predetermined time period, it is possible to change the threshold voltage of MNM1 to a desired extent (a few mV to a few ten mV). In this manner, a threshold voltage difference is intentionally created with respect to MNM1 and MNM2.

Figure 13A:
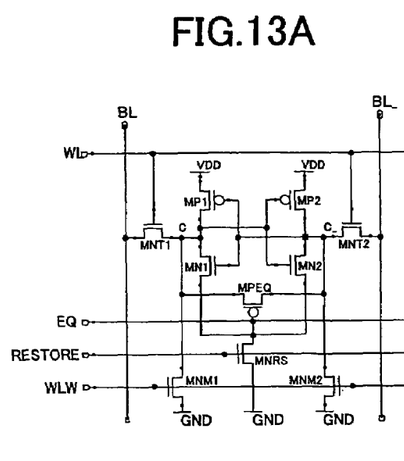
FIGS. 13A and 13B are illustrative drawings showing an operation of retrieving nonvolatile data with respect to the SRAM hybrid basic circuit according to the present invention (embodiment 4)
Figure 13B:
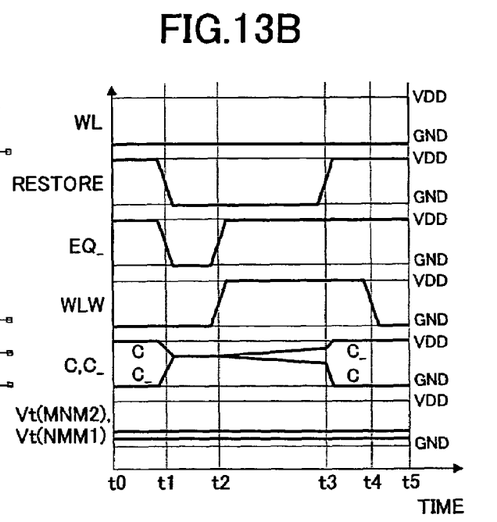

In order to read this threshold voltage difference as information, as shown in FIG. 13B, the level of the word line (WL) is set to a low level, and the RESTORE signal is brought down to the low level. With this, an EQ_ signal is also set to the low level for a predetermined duration, thereby setting the C node and C_ node to the same potential. With such settings of signal-line potentials, a latch circuit is formed by using the four transistors MNM1, MNM2, MP1, and MP2. Then, WLW is gradually raised from the low level to the high level. As a result, despite the fact that the drain voltages of MNM1 and MNM2 are initially at the high level, MNM1 and MNM2 experience different amounts of current flows due to the difference in their threshold voltages. Since a threshold voltage shift caused by hot carriers generally appears as a rise of the threshold voltage, MNM1 has a higher threshold voltage than MNM2 in the example described above. That is, MNM2 creates a larger amount of current flow. Due to a latch circuit operation, the drain node of MNM2 (the gate node of MNM1) is set to a slightly higher level than the drain node of MNM1 (the gate node of MNM2). At the end, the RESTORE signal is set to the high level, thereby allowing the information to be transferred to and stored in the conventional-SRAM-cell latch circuit portion comprised of the four transistors MP1, MP2, MN1, and MN2. In this manner, the information stored in MNM1 and MNM2 is readable from the exterior of the cell by using a conventional SRAM read operation. In the example described above, an electric current difference caused by the threshold voltage difference of MNM2 and MNM1 is utilized to transfer nonvolatile information. A similar readout circuit may also be designed by utilizing a principle that the transistor having the lower threshold voltage is turned on first based on the threshold voltage difference.

The embodiments of the present invention have been described with reference to an example in which a change in device characteristics is a change in the threshold caused by hot carriers. Any other phenomenon suffices if it causes a secular change in characteristics due to a continuous flow of a transistor drain current. Further, in FIG. 10A, the transistors (MNT1, MNT2 in FIG. 10A) for connecting between the memory cell and the bit lines are used for the purpose of writing information to the nonvolatile memory as well as for the purpose of routine SRAM operation. In order to optimize the performance of the circuit or the like, separate transistors may be provided. Further, in the description of the present invention, the state in which the first transistor has the higher threshold voltage is treated as "0" data, and the state in which the second transistor has the higher threshold voltage is treated as "1" data. Alternatively, such definition may be reversed.

As an advantage of the present invention, the configuration set forth in the claims can achieve a certain object, which is to implement a nonvolatile storage without introducing a new material or an additional manufacturing step to the CMOS-type process, thereby achieving cost reduction and shorter development periods.

Further, the present invention is not limited to these embodiments, but various variations and modifications may be made without departing from the scope of the present invention.

In the following, explanation of reference signs will be provided to facilitate the understanding of the drawings.

WL, WL1, WL2: Word Selecting Line
WLW: Nonvolatile Word Selecting Signal
RESTORE: Nonvolatile Data Restoring Signal
EQ_: Equalize Signal
C, C_: Differential Node Signal in Memory Cell
MNT1, MNT2, MN1, MN2, MNRS: n-Type MIS Transistor
MP1, MP2, MPEO: p-Type MIS Transistor
t0, t1, t2, t3, t4, t5: Time
BL, BL_, BL1, BL1_, BL2, BL2_, BL3, BL3_: Bit Lines (Those which have "_" at the end of their names represent signals for forming a differential pair. For example, BL_ forms a differential pair with BL.)
COMM, COMM1, COMM2: Common Line
WL_REF: Word Line for Selecting Reference Transistor
COMM_REF: Common Line for Reference Transistor
n+: n-Type Impurity Diffusion Layer.
p-sub: p-Type Substrate
PG: Gate Electrode
FG: Floating Gate Electrode
PL: Plate Electrode Terminal
OX: Insulating Film
MN00, MN01, MN02, MN03, MN10, MN11, MN12, MN13, MN20, MN21, MN22, MN23, MN001, MN002, MN011, MN012, MN101, MN102, MN111, MN112, MNM1, MNM2: n-Type MIS Transistor for Storing Nonvolatile Data
e: Electron
VDD: Power Supply Terminal
GND: Ground Terminal
Vp1: Plate Electrode Terminal
Vt(MNM1), Vt(MNM2): Threshold Voltages of MNM1 and MNM2, respectively
Vt0, Vt1, Vt2, Vt3, Vt4, Vt5: Threshold Voltage of nMIS Transistor for Nonvolatile Storage

What is claimed is:

1. A nonvolatile semiconductor memory circuit, comprising:
 a selection line;
 a first bit line;
 a second bit line;
 a first MIS transistor having a first gate coupled to said selection line, a first drain coupled to the first bit line via a first node, and a first source coupled to a predetermined potential; and
 a second MIS transistor having a second gate coupled to said selection line, a second drain coupled to the second bit line via a second node, and a second source coupled to said predetermined potential;
 wherein a potential of the selection line is configured to be controlled so as to create a first lingering change in a threshold voltage of the first MIS transistor and then a second lingering change in a threshold voltaae of the second MIS transistor, the second lingering ehanae being larger than the first lingering change.

* * * * *